(12) United States Patent
Jiang et al.

(10) Patent No.: US 8,313,991 B2
(45) Date of Patent: Nov. 20, 2012

(54) METHOD FOR FABRICATING A HIGH-K METAL GATE MOS

(75) Inventors: Li Jiang, Shanghai (CN); Mingqi Li, Shanghai (CN)

(73) Assignee: Semiconductor Manufacturing International Corp, Shanghai (CN)

( * ) Notice: Subject to any disclaimer, the term of this patent is extended or adjusted under 35 U.S.C. 154(b) by 0 days.

(21) Appl. No.: 13/178,455

(22) Filed: Jul. 7, 2011

(65) Prior Publication Data

US 2012/0164824 A1    Jun. 28, 2012

(30) Foreign Application Priority Data

Dec. 23, 2010   (CN) .......................... 2010 1 0604745

(51) Int. Cl.
*H01L 21/338* (2006.01)
*H01L 21/336* (2006.01)
*H01L 21/3205* (2006.01)
*H01L 21/4763* (2006.01)

(52) U.S. Cl. ........ 438/183; 438/287; 438/585; 438/592; 438/595; 257/E21.202; 257/E21.444; 257/E21.637

(58) Field of Classification Search .................. 438/585, 438/183, 287, 595, 592; 257/E21.202, E21.444, 257/E21.637
See application file for complete search history.

(56) References Cited

U.S. PATENT DOCUMENTS

| | | | | |
|---|---|---|---|---|
| 5,674,784 A * | 10/1997 | Jang et al. | ..................... | 438/692 |
| 6,100,558 A * | 8/2000 | Krivokapic et al. | .......... | 257/310 |
| 6,365,450 B1 * | 4/2002 | Kim | ............................. | 438/216 |
| 6,541,351 B1 * | 4/2003 | Bartlau et al. | ................ | 438/426 |
| 6,787,827 B2 * | 9/2004 | Inumiya et al. | ............... | 257/288 |
| 7,183,184 B2 | 2/2007 | Doczy et al. | | |
| 8,067,806 B2 * | 11/2011 | Lin et al. | ....................... | 257/369 |
| 2002/0058374 A1 * | 5/2002 | Kim et al. | ..................... | 438/228 |
| 2003/0073273 A1 * | 4/2003 | Azuma et al. | ................. | 438/200 |
| 2004/0259297 A1 * | 12/2004 | Inumiya et al. | ............... | 438/183 |
| 2008/0203576 A1 * | 8/2008 | Kikuchi et al. | ............... | 257/773 |
| 2010/0237504 A1 * | 9/2010 | Hong et al. | ................... | 257/758 |
| 2011/0163386 A1 * | 7/2011 | Jeong et al. | ................... | 257/369 |

* cited by examiner

*Primary Examiner* — Charles Garber
*Assistant Examiner* — Ron Pompey
(74) *Attorney, Agent, or Firm* — Anova Law Group, PLLC; Wenye Tan

(57) ABSTRACT

A method is provided for fabricating a high-K metal gate MOS device. The method includes providing a semiconductor substrate having a surface region, a gate oxide layer on the surface region, a sacrificial gate electrode on the gate oxide layer, and a covering layer on the sacrificial gate electrode, an inter-layer dielectric layer on the semiconductor substrate and the sacrificial gate electrode. The method also includes planarizing the inter-layer dielectric layer to expose a portion of the covering layer atop the sacrificial gate electrode, implanting nitrogen ions into the inter-layer dielectric layer until a depth of implantation is deeper than a thickness of the portion of the covering layer atop the sacrificial gate electrode and polishing the inter-layer dielectric layer to expose a surface of the sacrificial gate electrode, removing the sacrificial gate electrode, and depositing a metal gate.

20 Claims, 7 Drawing Sheets

METHOD FOR FABRICATING A HIGH-K METAL GATE MOS

CROSS-REFERENCES TO RELATED APPLICATIONS

This application claims the priority benefit of Chinese Patent Application No. 201010604745.0, entitled "Method for fabricating a high-K metal gate MOS", filed on Dec. 23, 2010, which is commonly owned and incorporated by reference herein for all purposes.

BACKGROUND OF THE INVENTION

The present invention generally relates to semiconductor, and more particularly, to a high-K metal gate MOS semiconductor devices.

As processes for fabricating complementary metal-oxide-semiconductor (CMOS) develop, scaling efforts of CMOS and MOS devices have moved to high-k dielectric materials that have dielectric constants greater than 3.9 of silicon dioxide and metal gate structures have replaced polysilicon gate structures.

FIG. 1 shows a cross-sectional view of a prior art MOS device including a sidewall dielectric layer 140, a sacrificial gate electrode 110, a covering layer 120 overlying the sacrificial gate electrode and an interlayer dielectric layer 130 overlying the covering layer.

FIG. 2 shows a cross-sectional view of the prior art device of FIG. 1, wherein a portion of the interlayer dielectric layer 130 has been removed to expose a portion of the covering layer 120. The portion of the interlayer dielectric layer can be removed using Chemical Mechanical Polishing (CMP). As shown in FIG. 3, while removing a portion of the covering layer to expose a portion of the sacrificial gate electrode, erosion 150 occurs at the edges of the interlayer dielectric layer adjacent to the covering layer. It is believed that the edges of the interlayer dielectric layer can be polished much faster than other surface areas of the interlayer dielectric layer. In addition, erosion may also occur on the surface portion of the sidewall dielectric layer that is disposed between the covering layer and the sacrificial gate electrode during the removal of the sacrificial gate electrode. For example, the sacrificial gate electrode can be removed by exposing it to a solution comprising between about 20 to about 30 percent Tetramethylammonium Hydroxide (TMAH) by volume in deionized water. FIG. 4 shows a cross-sectional view of FIG. 3 after the sacrificial gate electrode is removed. A subsequent metal deposition to fill a trench 160 left after the removal of the sacrificial gate electrode may also fills the erosion spaces, and thus affects the insulation characteristics of the interlayer dielectric layer and the performance of the device. This process has been described in U.S. Pat. No. 7,183,184 that discloses a method for making a semiconductor device having a metal gate electrode. However, it should be noted that examples cited in the patent do not provide adequate performance.

Accordingly, it would be desirable to have a method for fabricating a high-k metal gate electrode MOS device that reduces or eliminates erosion in a dielectric layer in a polishing process.

BRIEF SUMMARY OF THE INVENTION

Embodiments of the present invention provide a method for fabricating a high-K metal gate MOS device that reduces and eliminates dielectric erosion in a polishing process.

In one embodiment, a method for fabricating a high-K metal gate MOS device includes providing a semiconductor substrate, forming a gate oxide layer on a surface of the semiconductor substrate, forming a sacrificial gate electrode overlying the high-K dielectric layer, depositing a covering layer overlying the sacrificial gate electrode, and depositing an inter-layer dielectric layer overlying the semiconductor substrate. The method further includes planarizing the inter-layer dielectric layer until a portion of the covering layer atop the sacrificial gate electrode is exposed and implanting nitrogen ions in the inter-layer dielectric layer and the covering layer, wherein a depth of the nitrogen ions implantation is greater than a thickness of the portion of the covering layer atop of the sacrificial gate electrode. Additionally, the method includes polishing the inter-layer dielectric layer and the covering layer until a portion of the sacrificial gate electrode is exposed and removing the sacrificial gate electrode and the gate oxide layer to expose at least a portion of the surface region of the semiconductor substrate. The method further includes depositing a high-K dielectric layer overlying the exposed portion of the surface region of the semiconductor substrate and depositing a metallic layer overlying the high-K dielectric layer.

In one embodiment, the method further includes forming a sidewall dielectric layer disposed between sidewalls of the sacrificial gate electrode and the covering layer. In another embodiment, the method includes annealing the metallic layer and polishing the metallic layer.

In one embodiment, the inter-layer dielectric layer comprises silicon dioxide. In another embodiment, the covering layer comprises silicon nitride. In one embodiment, an abrasive used in polishing the inter-layer dielectric layer and the covering layer comprises ceria.

In one embodiment, the portion of the covering layer overlying the top of the sacrificial gate electrode is between about 100 angstroms thick and about 1000 angstroms thick.

In one embodiment, the dosage of nitrogen ions implantation ranges from about $1E14/cm^2$ to about $3E15/cm^2$. In another embodiment, the energy of nitrogen ions implantation ranges from about 3 KeV to about 20 KeV.

In one embodiment, the sidewall dielectric layer is made of silicon dioxide. In another embodiment, the sidewall dielectric layer is formed using a thermal oxidation process.

Embodiments of the present invention provide many benefits over conventional art. The present invention provides advantages in the fabrication of high-K metal gate MOS circuit devices that do not have erosion on the surface of the interlayer dielectric layer, and in particularly, at the edge areas of the inter-layer dielectric layer in the proximity of the covering layer. Depending upon the embodiment, one or more of these benefits may be achieved.

In one embodiment, the covering layer atop the sacrificial gate electrode is exposed by polishing the inter-layer dielectric layer which comprises silicon dioxide. Nitrogen ions are implanted in the inter-layer dielectric layer and the covering layer overlying the top of the sacrificial gate electrode, wherein the nitrogen ions react with the inter-layer dielectric layer to form silicon oxynitride and thus prevent erosion from occurring at the edge areas of the inter-layer dielectric layer in the proximity the covering layer in the polishing process. Because the polishing selectivity of the inter-layer dielectric layer is relatively low comparing to that of the covering layer, the covering layer can be polished without causing erosion in the inter-dielectric layer, and better performance of the high-K metal gate MOS circuit can thus be obtained.

Furthermore, the sidewall dielectric layer may include silicon dioxide that forms silicon oxynitride when reacting with nitrogen ions. The formed silicon oxynitride can prevent erosion when the sidewall dielectric layer is partly removed.

BRIEF DESCRIPTION OF THE DRAWINGS

The accompanying drawings, which are incorporated herein and form a part of the specification, and, together with the description, further serve to explain the principles of the embodiments of the invention and to enable a person skilled in the art to make and use the invention.

DETAILED DESCRIPTION OF THE INVENTION

Figure 1:
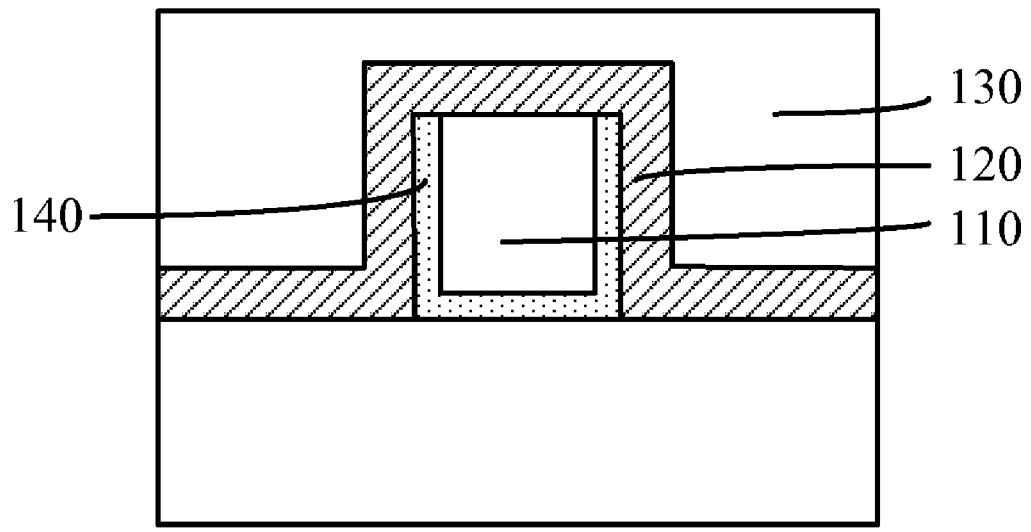
FIG. 1 to FIG. 4 are cross-sectional views of a Gate-last process in the prior art.
Figure 2:
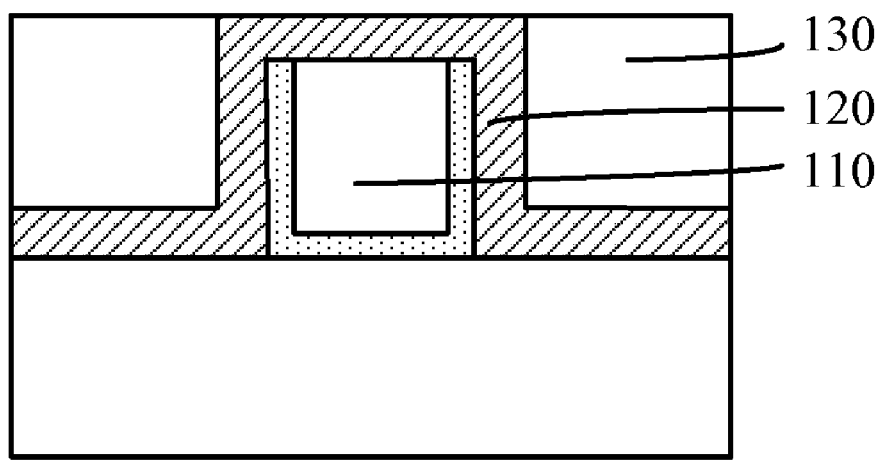
Figure 3:
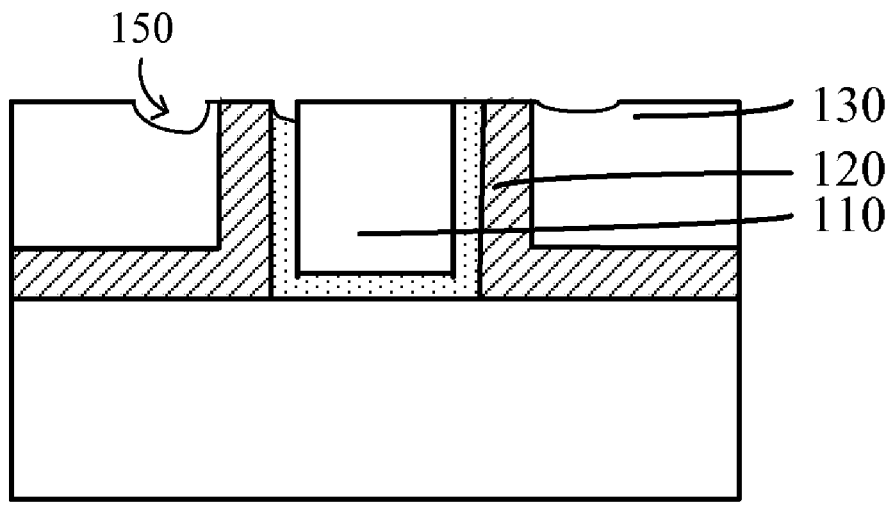
Figure 4:
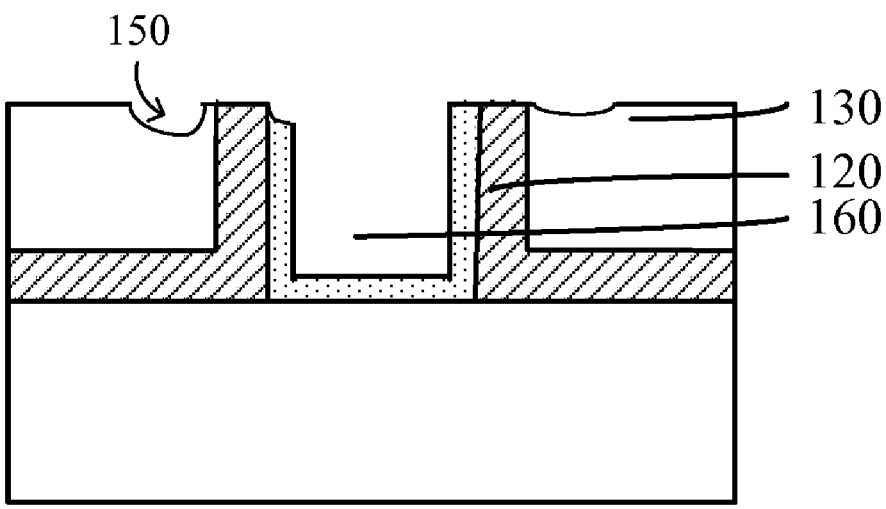
Figure 5:
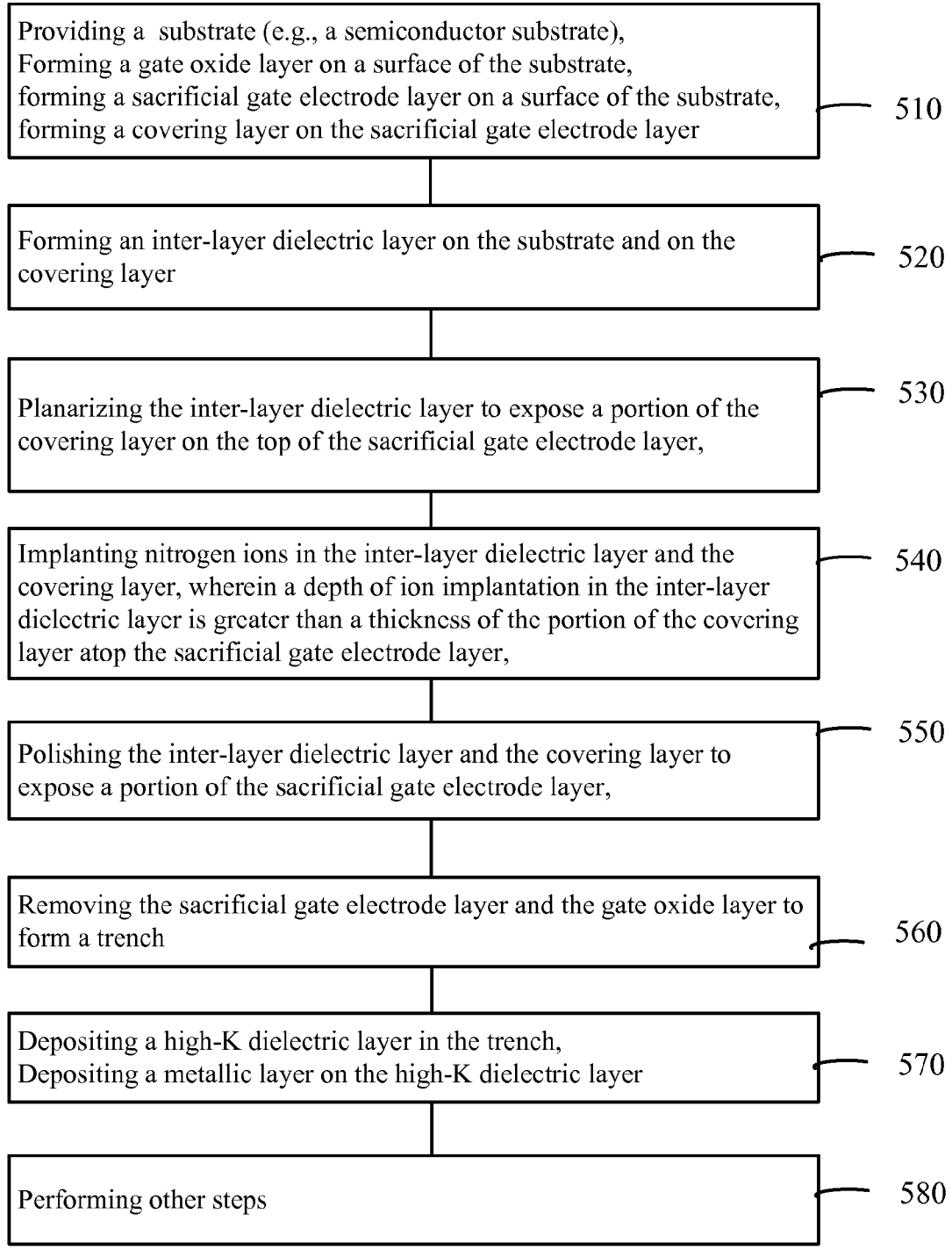
FIG. 5 is a flow chart of steps illustrating a method for fabricating a high-K metal gate MOS circuit according to one embodiment of the present invention.

A method for fabricating a high-k metal MOS circuit according to one embodiment of the present invention is described. FIG. 5 is a flow chart diagram of steps illustrating a method for fabricating a high-k metal gate MOS device according to an embodiment of the present invention. This diagram is merely an example, which should not unduly limit the scope of the claims herein. One of ordinary skill in the art would recognize other variations, modifications, and alternatives. As shown, the method includes providing a semiconductor substrate, forming a gate oxide layer on a surface region of the semiconductor substrate, forming a sacrificial gate electrode overlying the gate oxide layer, and depositing a covering layer overlying the sacrificial gate electrode (510). In a specific embodiment, a sidewall dielectric layer may be formed prior to depositing the covering layer. The sidewall dielectric layer may be formed using a thermal oxidation process to obtain high quality gate oxide, which is free from voids. The method further includes depositing an inter-layer dielectric layer overlying the semiconductor substrate and the covering layer (520) and planarizing the inter-layer dielectric layer until a portion of the covering layer atop the sacrificial gate electrode is exposed (530). An nitrogen ions implantation is applied to the inter-layer dielectric layer and the covering layer, wherein a depth of the ion implantation is greater than a thickness of the portion of the covering layer atop of the sacrificial gate electrode (540). Following the implantation of the nitrogen ions, the inter-layer dielectric layer and the covering layer are polished until a portion of the sacrificial gate electrode is exposed (550). The sacrificial gate electrode and the gate oxide layer are then removed to form a trench. The trench may expose a portion or the entire surface region of the semiconductor substrate. In an embodiment, the sacrificial gate electrode can be removed utilizing a wet etching process (560). A high-K dielectric layer is then deposited on the exposed portion or the entire surface region of the semiconductor substrate and a metallic layer is deposited on the high-K dielectric layer to fill at least a portion of the trench (570).

The above sequence of steps provides a method for making a variable capacitor according to an embodiment of the present invention. The method uses a combination of steps including a way of making high-K metal gate MOS device. Other alternatives can also be provided where steps are added, one or more steps are removed, or one or more steps are provided in a different sequence without departing from the scope of the claims herein. Further details of the present invention can be found throughout the present specification and more particular below.

As used herein, the term high-K denotes a dielectric material having a dielectric constant (K) higher than about 3.9. For the purposes of the description hereinafter, the term "vertical" is referred to the position oriented in the Figures, as are the terms "atop", "over", "on" or "overlying". Hereinafter, the terms "atop", "on", "over", and "overlying" will be used alternatively.

Figure 6:
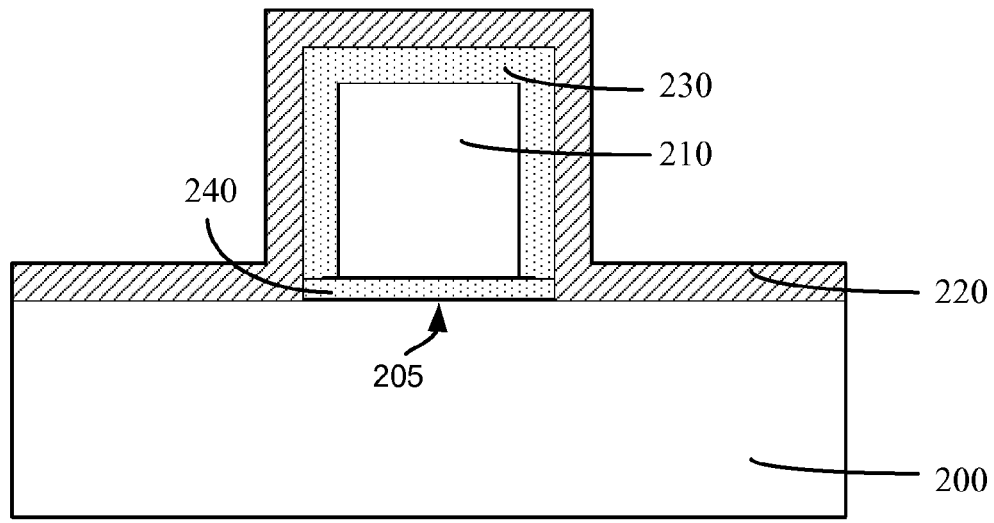
FIG. 6 to FIG. 12 are cross-sectional views of a method for fabricating a high-K metal gate MOS circuit according to one embodiment of the present invention.

With reference to FIG. 5, the process begins with step 510. FIG. 6 is a cross-sectional view illustrating the processing step 510. Process step 510 includes providing a semiconductor substrate 200, forming a gate oxide layer 240 on a surface region 205 of the semiconductor substrate, forming a sacrificial gate electrode 210 overlying the gate oxide layer 240, and forming a covering layer 220 overlying the sacrificial gate electrode 210. In a specific embodiment, a sidewall dielectric layer 230 can be formed on the sacrificial gate electrode 210 prior to forming the covering layer 220.

In an embodiment, semiconductor substrate 200 can be an N-type silicon substrate, a P-type silicon substrate, silicon on insulator (SOI) or other materials such as III-V compounds, e.g., GaAs. The sacrificial gate electrode 210 can include one of polysilicon, germanium, silicon germanium, silicon nitride, silicon oxide, or a combination thereof. In one embodiment, the sacrificial gate electrode 210 comprises polysilicon and has a thickness ranging from 1000 angstroms to 2000 angstroms.

In an embodiment, the covering layer 220 overlying the sacrificial gate electrode 210 comprises silicon nitride and can be formed using a Chemical Vapor Deposition (CVD) process. In some embodiments, the covering layer 220 covers the sacrificial gate electrode 210 and the semiconductor substrate 200. In other embodiments, the covering layer 220 overlying the semiconductor substrate 200 may be removed.

In a specific embodiment, the gate oxide layer 240 overlying the surface region 205 of the semiconductor substrate comprises silicon dioxide and is formed using a CVD process.

In an embodiment, the sidewall dielectric layer 230 disposed between the sacrificial gate electrode 210 and the covering layer 220 is formed using a thermal oxidation process and includes high quality gate oxide that is free from voids. In an embodiment, the sidewall dielectric layer 230 has a thickness ranging from about 20 angstroms to about 100 angstroms. The sidewall dielectric layer 230 can provide protection to the sacrificial gate electrode 210 and reduce the stress between the sacrificial gate electrode 210 and the covering layer 220.

Figure 7:
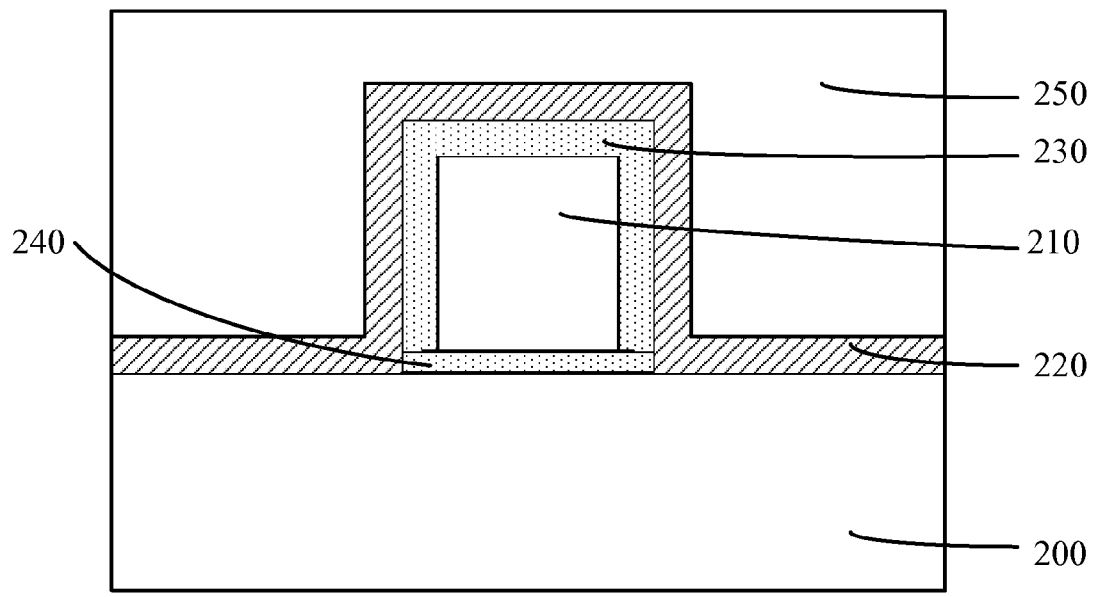

Referring again to FIG. 5, following step 510 is step 520. Subsequent to the forming of the covering layer 220, an inter-layer dielectric layer 250 is deposited on the semiconductor layer 200 and on the covering layer 220, as shown in FIG. 7. The inter-layer dielectric layer 250 can include an inorganic silicon based material having a low dielectric constant. In an exemplary embodiment, SiCO and FSG may be used that have low dielectric constants lower than 3.0. In an embodiment, the inter-layer dielectric 250 includes silicon dioxide and is formed using a CVD process.

Figure 8:
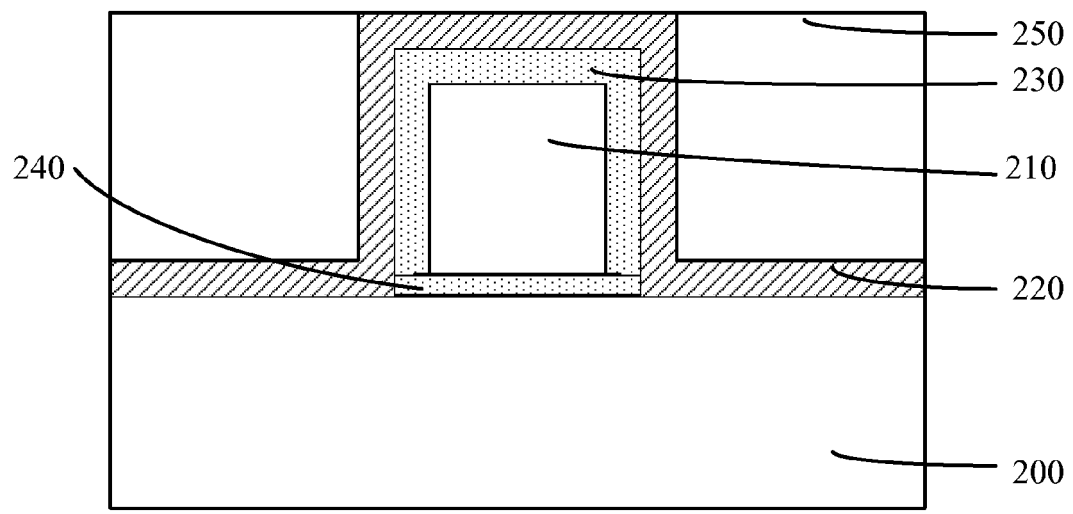

FIG. 8 illustrates the process step 530, where the inter-layer dielectric layer 210 is planarized until a portion of the covering layer 220 atop the sacrificial gate electrode 210 is exposed. Planarizing a surface, or polishing a surface, is a process where material is removed to form a generally even, planar surface. Planarizing or polishing will be used alternately hereinafter. Planarizing or polishing is used to remove excess deposited material of the inter-layer dielectric layer 250. Planarizing provides a level surface for the inter-layer dielectric layer and the covering layer for further processing. The planarizing process will be stopped when the portion of the covering layer atop the sacrificial gate electrode 210 is exposed. The planarizing or polishing process is compatible with conventional process technology without substantial modifications to conventional equipment and process. In an embodiment, the planarizing or polishing process utilizes abrasives that include ceria. By mixing the abrasives including ceria with chemical additives, the abrasives can have high polishing selectivity, and tiny scratches in the formation of semiconductor devices after polishing are restrained.

Figure 9:
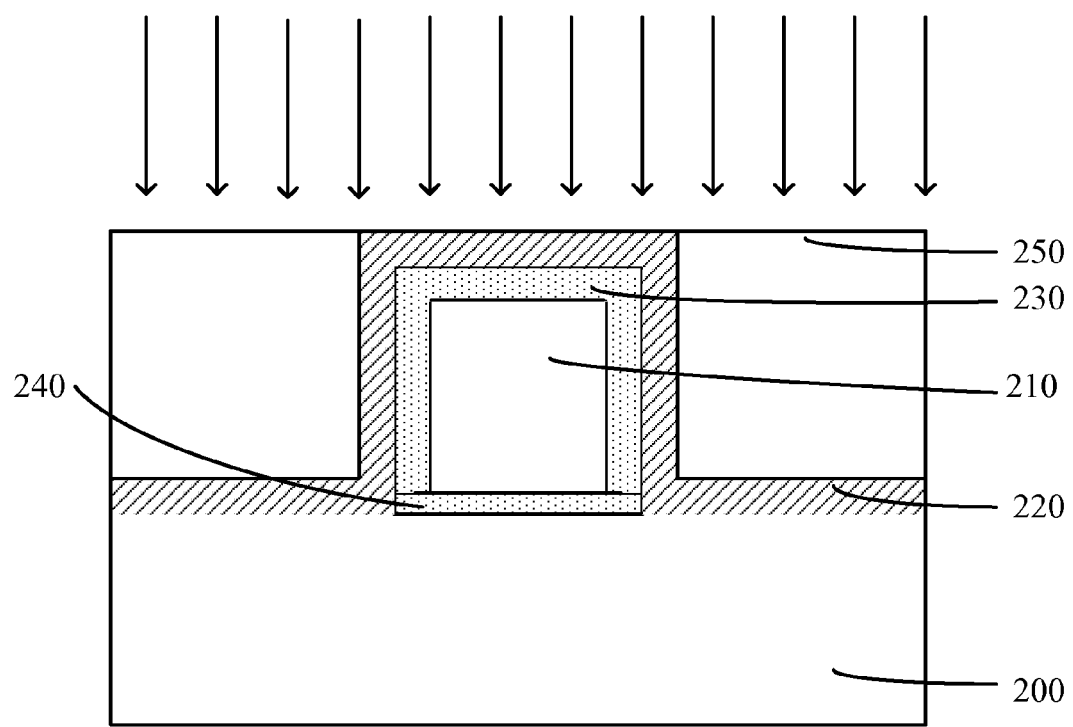

Referring to FIG. 9, nitrogen ions are implanted into the inter-layer dielectric layer 250 and the covering layer 220 until the depth of ion implantation is greater than the thickness of the portion of the covering layer 220 atop the sacrificial gate electrode 210 (process step 540).

The depth of nitrogen ions implantation can be controlled by the implantation dosage and implantation energy of nitrogen ions. In an embodiment, the dosage of nitrogen ions implantation is between $1E14/cm^2$ and $3E15/cm^2$, and the energy of implantation is between 3 KeV and 20 KeV, and the direction of the implantation is vertical. In a specific embodiment, the dosage of nitrogen ions implantation is $1E15/cm^2$ and the energy of nitrogen ions implantation is 5 KeV.

In an embodiment, the difference between the depth of nitrogen ions implantation and the thickness of the portion of the covering layer atop the sacrificial gate electrode is between 100 angstroms and 200 angstroms. In an embodiment, the portion of the covering layer 220 atop the sacrificial gate electrode 210 has a thickness ranging between 100 angstroms and 1000 angstroms. After numerous experimentations, the inventors discovered that a flat surface of the inter-layer dielectric layer and the covering layer may not be achieved if the depth of nitrogen ions implantation is too shallow. The inventors also discovered that erosion occurs in the gate dielectric 230 layer while removing the sacrificial gate electrode if the depth of nitrogen ions implantation is too deep, and removing the sidewall dielectric layer 230 having implanted nitrogen ions and the sacrificial gate electrode 210 may also be challenging. According to a preferred embodiment, a difference between the depth of nitrogen ions implantation and the thickness of the portion of the covering layer atop the sacrificial gate electrode of 120 angstroms provides an optimal result.

Figure 10:
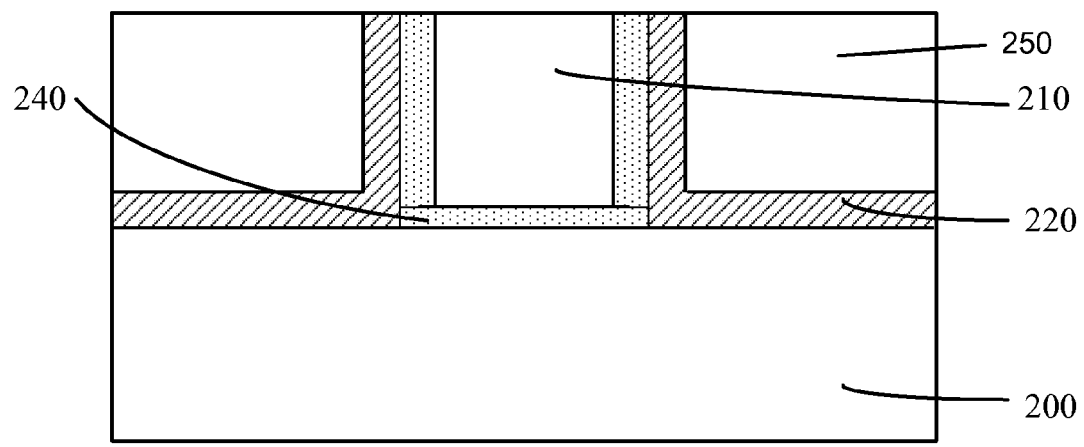

FIG. 10 illustrates the process 550, where the inter-layer dielectric layer 250 and the covering layer 220 are polished until the sacrificial gate electrode 210 is exposed. In an embodiment, the inter-dielectric layer 250 comprises silicon dioxide that reacts with the implanted nitrogen ions to produce silicon oxynitride (SiON). In an embodiment, the covering layer 220 atop the sacrificial gate electrode 210 comprises silicon nitride that does not react with the implanted nitrogen ions. Because of low polishing selectivity of abrasives, erosion will not occur while polishing the surface of the inter-layer dielectric layer 250 and the covering layer 220, and the surface is even or planar.

In contrast, in the prior art, the inter-layer dielectric 250 and the covering layer 220 are planarized or polished without nitrogen ions implementation. Because of high polishing selectivity of the abrasive on silicon dioxide and silicon nitride, erosion occurs in the edge areas of the inter-layer dielectric layer 250 and the covering layer 220. In some cases, erosion even occurs in areas of the inter-layer dielectric layer 250 away from the covering layer 250.

Erosion spaces formed in the edge areas of the inter-layer dielectric layer 250 and the covering layer 220 may be filled with metallic material when a metallic layer is deposited in the trench to form a metal gate. The presence of metallic material in the erosion spaces lowers the isolation of the inter-layer dielectric layer, and performance of a device is then reduced. In some cases, the presence of metallic material in the erosion spaces may even cause short circuit in a metal gate MOS device. Embodiments according to the present invention provide an even level surface of the inter-layer dielectric layer so that the erosion problems can be avoided.

Figure 11:
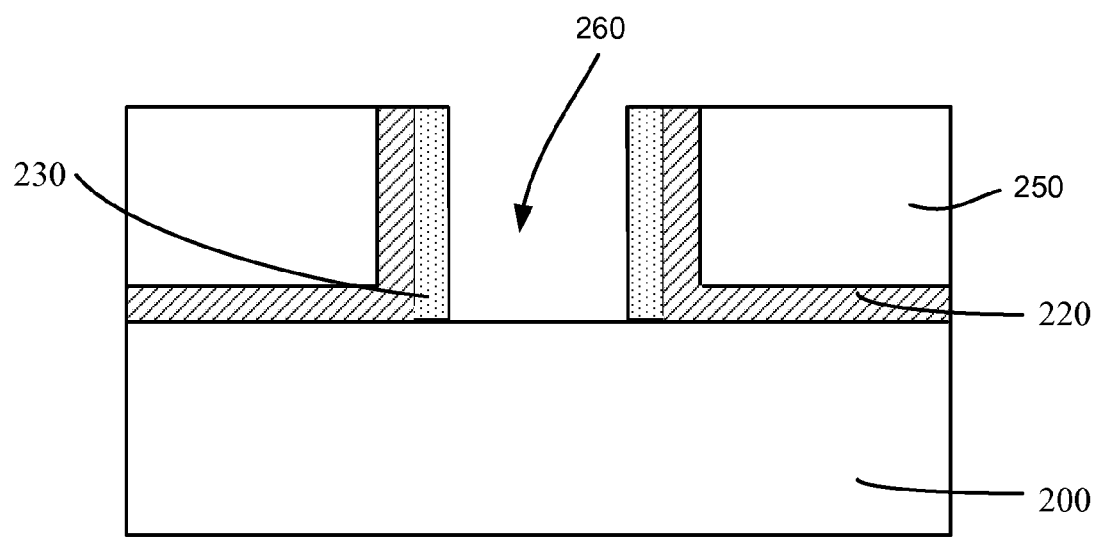

FIG. 11 illustrates a simplified process of forming a trench 260 by removing the sacrificial gate electrode 210 (step 560). The sacrificial gate electrode 210 can be removed using a wet etching process that may utilize Tetramethylammonium hydroxide pentahydrate (TMAH). In a specific embodiment, a mixed solution of nitric acid and Hydrofluoric Acid can be used in the wet etching process to remove the sacrificial gate electrode 210. Due to the fact that the gate dielectric 230 comprises silicon dioxide that reacts with the implanted nitrogen ions to form silicon oxynitride, the formed silicon oxynitride in the sidewall dielectric layer 230 prevents formation of erosion while removing the sacrificial gate electrode using the mixed solution of nitric acid and hydrofluoric Acid. Step 560 also includes removing the gate oxide layer 240. In a specific embodiment, the gate oxide layer 240 can be thinned or completely removed using a wet process. In an embodiment, the sacrificial gate electrode and the gate oxide layer are removed so that at least a portion or the entire surface region 205 of the semiconductor substrate is exposed.

Figure 12:
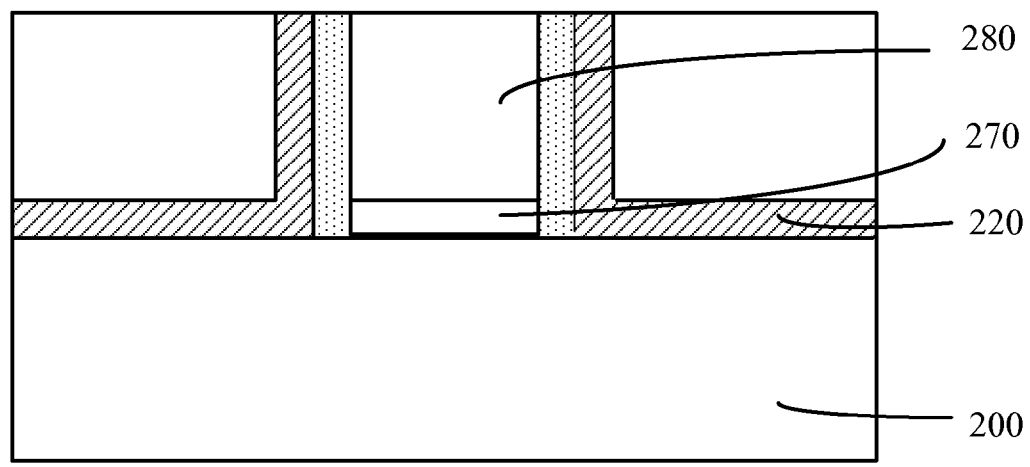

Following step 560 is step 570. FIG. 12 shows the process of forming a metal gate of step 570. Step 570 includes depositing a high-K sidewall dielectric layer 270 in the trench 260. In an embodiment, the High-K sidewall dielectric layer 270 has a thickness ranging 5 angstroms to 60 angstroms, preferably, 40 angstroms. Step 570 further includes depositing a metallic layer 280 overlying the high-K sidewall dielectric layer. The metallic layer 280 and the high-K sidewall dielectric layer 270 form the metal gate. In an embodiment, the metallic layer 280 comprises Al, Cu, Ag, Au, Pt, Ni, Ti, TiN, TaN, Ta, TaC, TaSiN, W, WN, or WSi, or a combination thereof.

Following step 570 is step 580 that performs other steps. In an exemplary embodiment, step 580 includes annealing the metallic layer and polishing the annealed metallic layer. Additional processing steps may be used to complete the fabrication of the high-K metal gate MOS device.

By now it should be appreciated that a method for fabricating a high-K metal gate has been disclosed. In the disclosed method, a semiconductor substrate is provided that includes a surface region, a gate oxide layer is formed over the surface region, a sacrificial gate electrode is formed over the gate oxide layer, a covering layer is deposited over the sacrificial gate electrode, and an inter-interlayer dielectric layer is deposited over the semiconductor substrate and the covering layer. The inter-interlayer dielectric layer is then planarized until a portion of the covering layer atop of the sacrificial gate electrode is exposed. Nitrogen ions are then implanted into the inter-layer dielectric layer and the covering layer. The nitrogen ions implantation is stopped when a depth of the implanted nitrogen ions is deeper than a thickness of the exposed portion of the covering layer atop the sacrificial gate electrode. In an embodiment, the inter-layer dielectric layer comprises silicon oxide that reacts with the implanted nitrogen ions to form silicon oxynitride (SiON). Because of the relatively low polishing resistivity of the silicon oxynitride, the surface of the inter-layer dielectric layer is even and free from erosion in the planarization process.

In an embodiment, a sidewall dielectric layer is formed over the sacrificial gate electrode prior to forming the covering layer. The gate dielectric may include silicon dioxide and has a thickness ranging from about 20 angstroms to about 100 angstroms. The silicon dioxide may react with the nitrogen implanted ions to form silicon oxynitride. Because of the relatively low polishing resistivity of the silicon oxynitride, the surface of the sidewall dielectric layer is free from erosion when a subsequent polishing step is performed to the inter-layer dielectric layer and the covering layer to expose a portion of the sacrificial gate electrode.

Although the present invention has been disclosed above with reference to preferred embodiments thereof, it should be understood that the invention is presented by way of example only, and not limitation. Those skilled in the art can modify and vary the embodiments without departing from the spirit and scope of the present invention. Accordingly, the scope of the present invention shall be defined in the appended claims.

What is claimed is:

1. A method for fabricating a high-K metal gate MOS device, the method comprising:
   providing a semiconductor substrate;
   forming a gate oxide layer over a surface region of the semiconductor substrate;
   forming a sacrificial gate electrode overlying the gate oxide layer;
   depositing a covering layer overlying the sacrificial gate electrode;
   depositing an inter-layer dielectric layer overlying the semiconductor substrate and the covering layer;
   planarizing the inter-layer dielectric layer until a portion of the covering layer atop the sacrificial gate electrode is exposed;
   implanting nitrogen ions in the inter-layer dielectric layer and the covering layer, wherein a depth of the nitrogen ions implantation is greater than a thickness of the portion of the covering layer atop the sacrificial gate electrode;
   polishing the inter-layer dielectric layer and the covering layer until a portion of the sacrificial gate electrode is exposed;
   removing the sacrificial gate electrode and the gate oxide layer to expose at least a portion of the surface region of the semiconductor substrate;
   depositing a high-K dielectric layer overlying the exposed portion of the surface region of the semiconductor substrate; and
   depositing a metallic layer overlying the high-K dielectric layer.

2. The method of claim 1 further comprising forming a sidewall dielectric layer overlying the sacrificial gate electrode prior to forming the covering layer.

3. The method of claim 2, wherein the sidewall dielectric layer comprises silicon dioxide that reacts with the implanted nitrogen ions to form silicon oxynitride.

4. The method of claim 3, wherein the sidewall dielectric layer has a high selectivity relative to the polishing selectivity of abrasives.

5. The method of claim 2, wherein the sidewall dielectric layer has a thickness ranging from about 20 angstroms to about 100 angstroms.

6. The method of claim 2, wherein forming the sidewall dielectric layer comprises a thermal oxidation process of the sacrificial gate electrode.

7. The method of claim 1, wherein the inter-layer dielectric layer comprises silicon dioxide.

8. The method of claim 1, wherein the inter-layer dielectric layer comprises an inorganic silicon-based material having a dielectric constant of about 3.0 or less.

9. The method of claim 1, wherein the thickness of the portion of the covering layer atop the sacrificial gate electrode ranges from 100 angstroms to 1000 angstroms.

10. The method of claim 1, wherein depositing the metallic layer comprises depositing a metal-based layer comprising Al, Cu, Ag, Au, Pt, Ni, Ti, TiN, TaN, Ta, TaC, TaSiN, W, WN, Wsi, or a combination thereof.

11. The method of claim 1, wherein a difference between the depth of the nitrogen ions implantation and the thickness of the portion of the covering layer atop the sacrificial gate electrode ranges between 100 angstroms and 200 angstroms.

12. The method of claim 1, wherein planarizing the inter-layer dielectric layer and the covering layer comprises using an abrasive including ceria.

13. The method of claim 1, wherein removing the sacrificial gate electrode comprises using a mixed solution of nitric acid and hydrofluoric acid.

14. The method of claim 1, wherein the dosage of the nitrogen ions implantation ranges between $1E14/cm^2$ and $3E15/cm^2$.

15. The method of claim 1, wherein the energy of the nitrogen ions implantation ranges between 3 KeV and 20 KeV.

16. The method of claim 1, wherein the covering layer comprises silicon nitride.

17. The method of claim 1, wherein the sacrificial gate electrode comprises polysilicon, germanium, silicon germanium, silicon nitride, silicon oxide, or a combination thereof.

18. The method of claim 1, wherein the sacrificial gate electrode has a thickness ranging from 1000 angstroms to 2000 angstroms.

19. The method of claim 1, wherein the high-K dielectric layer has a thickness ranging from about 5 angstroms to about 60 angstroms.

20. The method of claim 1 further comprising:
   annealing the metallic layer; and
   polishing the metallic layer.

* * * * *